US012016158B2

(12) United States Patent
Kim et al.

(10) Patent No.: US 12,016,158 B2
(45) Date of Patent: Jun. 18, 2024

(54) HEAT RADIATING STRUCTURE AND ELECTRONIC DEVICE INCLUDING SAME

(71) Applicant: SAMSUNG ELECTRONICS CO., LTD., Suwon-si (KR)

(72) Inventors: Jungho Kim, Suwon-si (KR); Minsoo Kim, Suwon-si (KR); Gunhyuk Yoon, Suwon-si (KR); Jinwan An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 929 days.

(21) Appl. No.: 16/968,475

(22) PCT Filed: Feb. 7, 2019

(86) PCT No.: PCT/KR2019/001542
§ 371 (c)(1),
(2) Date: Aug. 7, 2020

(87) PCT Pub. No.: WO2019/156487
PCT Pub. Date: Aug. 15, 2019

(65) Prior Publication Data
US 2020/0404808 A1    Dec. 24, 2020

(30) Foreign Application Priority Data

Feb. 9, 2018   (KR) .................. 10-2018-0016222

(51) Int. Cl.
*H05K 7/20*       (2006.01)
*G06F 1/20*       (2006.01)
(Continued)

(52) U.S. Cl.
CPC ......... *H05K 7/20454* (2013.01); *G06F 1/203* (2013.01); *H04R 7/02* (2013.01);
(Continued)

(58) Field of Classification Search
CPC ...... H05K 7/20454; G06F 1/203; H04R 7/08; H04R 9/022
See application file for complete search history.

(56) References Cited

U.S. PATENT DOCUMENTS 8,311,264 B2 * 11/2012 Lee .................. H04R 9/022
                                              381/431
8,682,020 B2 *  3/2014 Wilk ................ H04M 1/03
                                              381/396
(Continued)

FOREIGN PATENT DOCUMENTS

JP    2008-278235    11/2008
JP    2014-99823      5/2014
(Continued)

OTHER PUBLICATIONS

Notification of the Reasons for Rejection dated Feb. 28, 2022 in KR Application No. 10-2018-0016222 and English-language translation.

(Continued)

*Primary Examiner* — Robert J Hoffberg
(74) *Attorney, Agent, or Firm* — Nixon & Vanderhye, P.C.

(57) ABSTRACT

An electronic device according to various embodiments of the present invention may comprise: a housing including a front plate, a rear plate oriented in a direction opposite to the front plate, and a side member for surrounding a space between the front plate and the rear plate; a display exposed to the outside through the front plate, wherein the side member includes at least one through hole; a middle plate disposed between the display and the rear plate and including a surface oriented toward the rear plate; and a speaker structure disposed in the space which is adjacent to the through hole and is disposed between the middle plate and the rear plate, wherein the speaker structure includes: a (Continued)

metal plate attached to the surface of the middle plate; a yoke disposed apart from the metal plate toward the rear plate; a heat conducting member (TIM) disposed between and in contact with the metal plate and the yoke; and a vibration plate disposed apart from the yoke toward the rear plate; and a magnet disposed between the yoke and the vibration plate. Various other embodiments may also be possible.

9 Claims, 12 Drawing Sheets

(51) Int. Cl.
  *H04R 7/02* (2006.01)
  *H04R 7/08* (2006.01)
  *H04R 9/02* (2006.01)
(52) U.S. Cl.
  CPC ............... *H04R 7/08* (2013.01); *H04R 9/022* (2013.01); *H04R 2499/11* (2013.01)

(56) References Cited

U.S. PATENT DOCUMENTS

| | | | | |
|---|---|---|---|---|
| 9,167,324 | B2* | 10/2015 | Yang | H04R 1/021 |
| 9,778,710 | B2* | 10/2017 | Kim | H01M 10/6554 |
| 10,320,067 | B2* | 6/2019 | Jeon | H04B 5/0025 |
| 10,412,476 | B2* | 9/2019 | Lim | H04R 1/028 |
| 11,159,891 | B2* | 10/2021 | Kim | H04R 7/16 |
| 11,228,832 | B2* | 1/2022 | Sim | H04R 1/345 |
| 11,237,602 | B2* | 2/2022 | Yoon | G06F 1/1626 |
| 11,792,563 | B2* | 10/2023 | Kim | H04R 1/24 381/338 |
| 2011/0085694 | A1 | 4/2011 | Lee | |
| 2013/0089231 | A1 | 4/2013 | Wilk et al. | |
| 2014/0240985 | A1 | 8/2014 | Kim et al. | |
| 2016/0313773 | A1 | 10/2016 | Kim et al. | |
| 2017/0214132 | A1 | 7/2017 | Jeon | |
| 2018/0035188 | A1 | 2/2018 | Lim et al. | |

FOREIGN PATENT DOCUMENTS

| | | |
|---|---|---|
| KR | 10-2011-0105471 | 9/2011 |
| KR | 10-2013-0037167 | 4/2013 |
| KR | 10-2014-0116355 | 10/2014 |
| KR | 10-2016-0125804 | 11/2016 |
| KR | 10-2017-0089219 | 8/2017 |
| WO | 2016/185936 | 11/2016 |

OTHER PUBLICATIONS

International Search Report for PCT/KR2019/001542 dated May 16, 2019, 5 pages.
Written Opinion of the ISA for PCT/KR2019/001542 dated May 16, 2019, 3 pages.

* cited by examiner

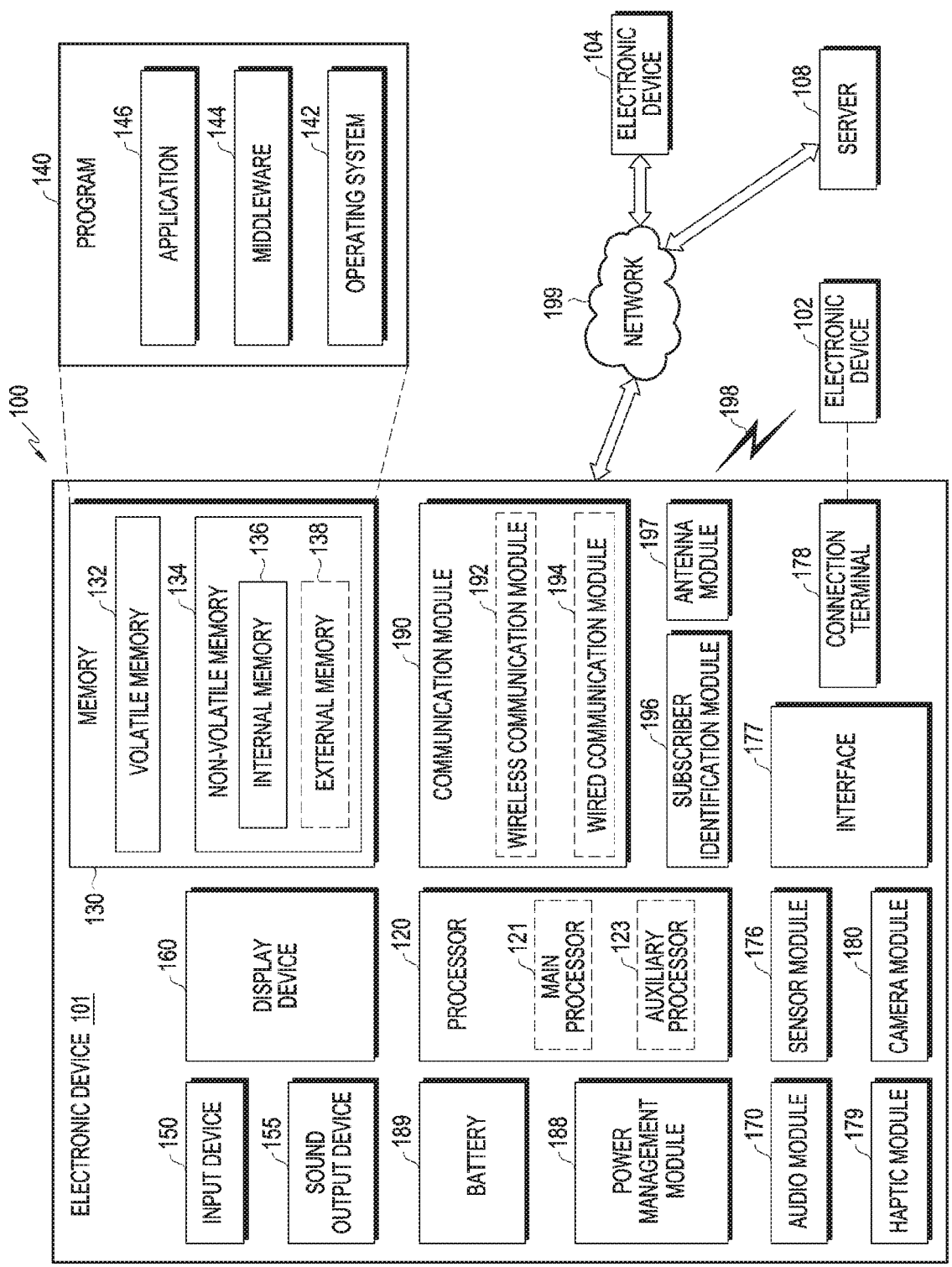

HEAT RADIATING STRUCTURE AND ELECTRONIC DEVICE INCLUDING SAME

CROSS-REFERENCE TO RELATED APPLICATIONS

This application is a National Phase Entry of PCT International Application No. PCT/KR2019/001542, which was filed on Feb. 7, 2019 and claims priority to Korean Patent Application No. 10-2018-0016222, which was filed on Feb. 9, 2018 in the Korean Intellectual Property Office, the contents of which are incorporated herein by reference.

BACKGROUND

1. Field

The disclosure relates to a heat radiating structure and an electronic device including the same.

2. Description of Related Art

Electronic devices may refer to devices, such as electronic notes, portable multimedia players, mobile communication terminals, tablet PCs, image/sound devices, desktop/laptop computers, and vehicular navigation systems, including home appliances, which perform specific functions according to mounted programs. For example, the electronic device may output stored information through sounds or images. With the increase of the degree of integration and the popularization of hyper-speed and high-capacity wireless communication, recently, the electronic devices have various functions. For example, in addition to a communication function, an entertainment function such as a game, a multimedia function such as playback of music/videos, a communication/security function for mobile banking, and functions such as schedule management or electronic purse are integrated in one electronic device.

When the entertainment functions and the multimedia functions are utilized, the qualities of the screen and the sound output from the electronic device may be a reference for increasing the satisfaction of the users. The screen quality may be secured through a display panel of a large screen and a high resolution, and the sound quality may be secured through a speaker having a uniform output at an audible frequency band.

The speaker may include a vibration plate that faces the front surface of the electronic device, and a magnet and a coil that face the rear surface of the electronic device, and the coil becomes an electromagnet if an AC current is applied to the coil whereby the electromagnet is changed into an N pole and an S pole in response to an electrical signal, and the vibration plate attached to the coil may vibrate upwards and downwards as the coil applies an attractive force and a repulsive force to the magnet. The vibration plate may generate sound through vibration.

SUMMARY

According to the intensity of a current applied to the speaker and the operation time of the speaker, heat may be generated by the coil. Most of the heat generated by the coil may be transferred to a magnet having a low thermal resistance, and the heat of the magnet may be directly transferred to a rear cover of the electronic device. A hot spot in which heat is concentrated may be generated in an area of the rear cover, which corresponds to the location of the magnet.

When heat is excessively generated by the speaker, the intensity of the current may be restricted by reducing the intensity of the current applied to the coil or adjusting the frequency band of the vibration to a specific frequency band to solve the heat emission problem, but the output of the sound of the speaker may be restricted.

Further, due to the heat emission of the speaker, the components in the interior of the speaker may be deformed or damaged.

Various embodiments of the disclosure provide a heat radiating structure that smoothly discharges heat generated by a speaker and an electronic device including the same.

In accordance with an aspect of the disclosure, there is provided an electronic device including: a housing including a front plate, a rear plate opposed to the front plate, a side member surrounding a space between the front plate and the rear plate, the side member including at least one through-hole; a display exposed to the outside through the front plate; a middle plate disposed between the display and the rear plate and including a surface facing the rear plate; and a speaker structure located in the space that is adjacent to the through-hole between the middle plate and the rear plate, and the speaker structure may include: a metal plate attached to the surface of the middle plate; a yoke disposed apart from the metal plate toward the rear plate; a thermal interface material (TIM) located between the metal plate and the yoke while contacting the metal plate and the yoke; a vibration plate disposed apart from the yoke toward the rear plate, and disposed apart from the rear plate; and a magnet disposed between the yoke and the vibration plate.

In accordance with an aspect of the disclosure, there is provided an electronic device including: a housing including a front plate, a rear plate opposed to the front plate, a side member surrounding a space between the front plate and the rear plate, the side member including at least one through-hole; a display exposed to the outside through the front plate; a middle plate disposed between the display and the rear plate and including a surface facing the rear plate; and a speaker structure located in the space that is adjacent to the through-hole between the middle plate and the rear plate, and the speaker structure may include: a metal plate; a yoke disposed apart from the metal plate toward the rear plate; a first thermal interface material (TIM) located between the metal plate and the yoke while contacting the metal plate and the yoke; a vibration plate disposed apart from the yoke toward the rear plate, and disposed apart from the rear plate; and a magnet disposed between the yoke and the vibration plate, and a second thermal interface material (TIM) may be located between the metal plate of the speaker structure and the middle plate while contacting the metal plate and the middle plate.

In accordance with an aspect of the disclosure, there is provided a heat radiating structure which may include: a housing including a front plate, a rear plate opposed to the front plate, a side member surrounding a space between the front plate and the rear plate, the side member including at least one through-hole; a display exposed to the outside through the front plate; a middle plate disposed between the display and the rear plate and including a surface facing the rear plate; and a speaker structure located in the space that is adjacent to the through-hole between the middle plate and the rear plate, and the speaker structure may include a speaker and a heat radiating structure configured to transfer heat generated by the speaker to the housing, and the heat radiating structure may include: a first thermal interface material configured to receive heat from the speaker while contacting the speaker; a metal plate configured to receive heat from the first thermal interface material while contacting the first thermal interface material; and a second thermal interface material configured to receive heat from the metal plate while contacting the metal plate and transfer the heat to a cooling member of the electronic device.

The heat radiating structure included in an electronic device according to various embodiments of the disclosure can guarantee the quality of the sound of the speaker by promptly dispersing the heat generated by the speaker to the outside of the electronic device.

The heat radiating structure included in an electronic device according to various embodiments of the disclosure can prevent a hot spot from being generated on a surface of the electronic device due to the heat generated by the speaker.

BRIEF DESCRIPTION OF THE DRAWINGS

FIG. 1 illustrates a block diagram of an electronic device in a network environment according to various embodiments.

DETAILED DESCRIPTION

Figure 2A:
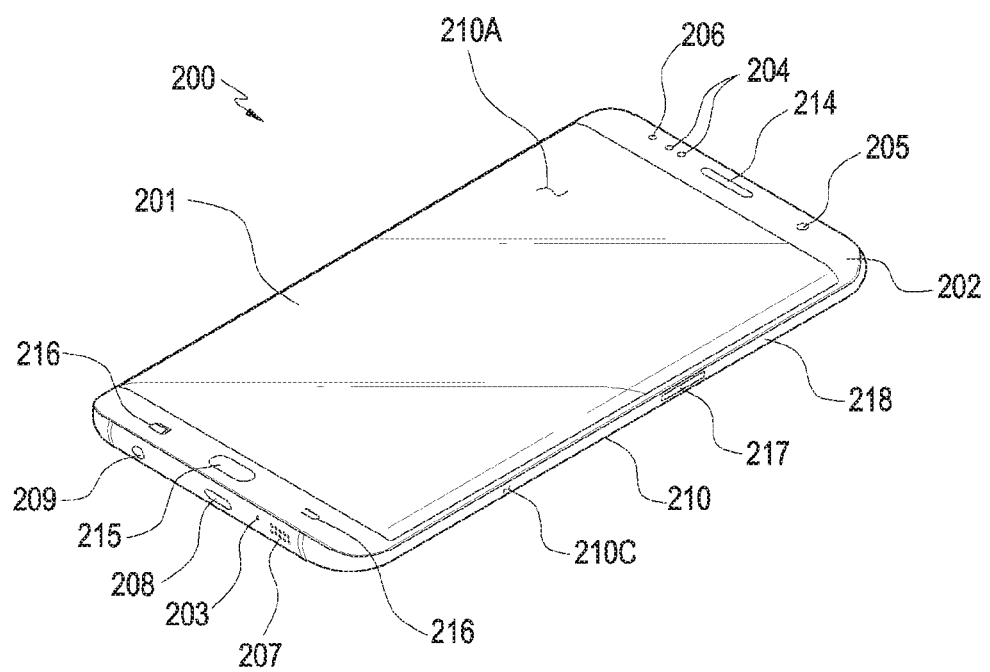
FIG. 2A is a perspective view illustrating a front surface of an electronic device according to various embodiments of the disclosure.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular expression may include plural expressions, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. Expressions such as "first," "second," "primarily," or "secondary," used herein may represent various elements regardless of order or importance and do not limit corresponding elements. When it is described that an element (such as a first element) is "(operatively or communicatively) coupled with/to" or "connected" to another element (such as a second element), the element can be directly connected to the other element or can be connected to the other element through another element (e.g., a third element).

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented as an application-specific integrated circuit (ASIC).

Various embodiments as set forth herein may be implemented as software (e.g., the program 140) including an instruction that is stored in a machine-readable storage medium (e.g., internal memory 136 or external memory 138) that is readable by a machine (e.g., a computer). The machine is device capable of invoking the stored instruction and operating according to the invoked instruction, and may include the electronic device (e.g., the electronic device 101) according to the embodiments disclosed herein. When the instruction is executed by the processor (the processor 120), the processor may perform functions corresponding to the instruction directly, or using other components under the control of the processor. The instruction may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., PlayStore™). If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. Some of the above-described sub-components may be omitted, or other sub-components may be added to various embodiments. Alternatively or additionally, some components (e.g., modules or programs) may be integrated into a single component, and the integrated component may still perform functions of each of some of components in the same or similar manner as they are performed by a corresponding one of some of components before the integration. According to various embodiments, operations performed by the module, the program, or another component may be carried out sequentially, in parallel, repeatedly, or heuristically, or one or more of the operations may be executed in a different order or omitted, or other operations may be added.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include at least one antenna, and in such a case, at least one antenna appropriate for a communication scheme used in the communication network, such as the first network 198 or the second network 199, may be selected, for example, by the communication module 190. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2B:
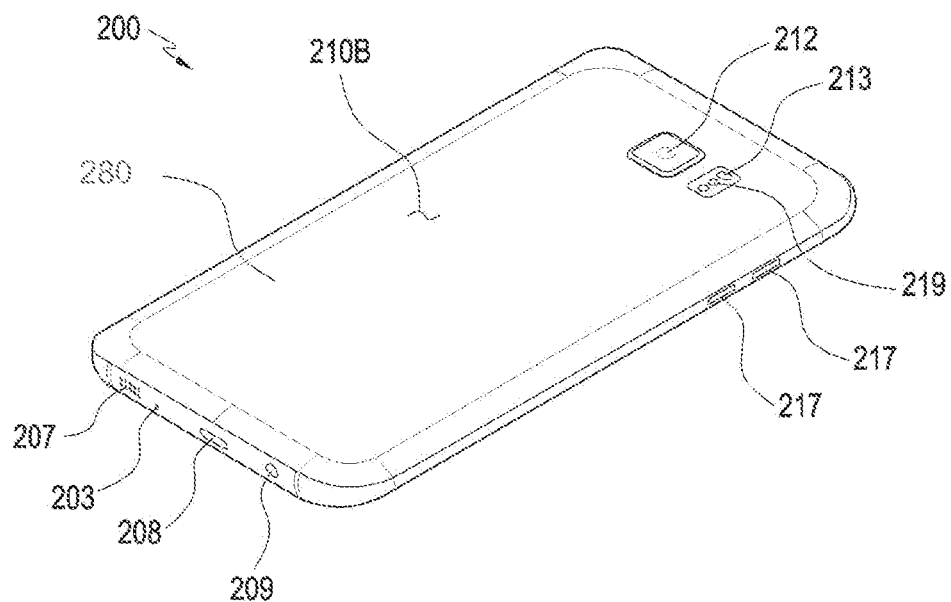
FIG. 2B is a perspective view illustrating a rear surface of an electronic device according to various embodiments of the disclosure.
Figure 2C:
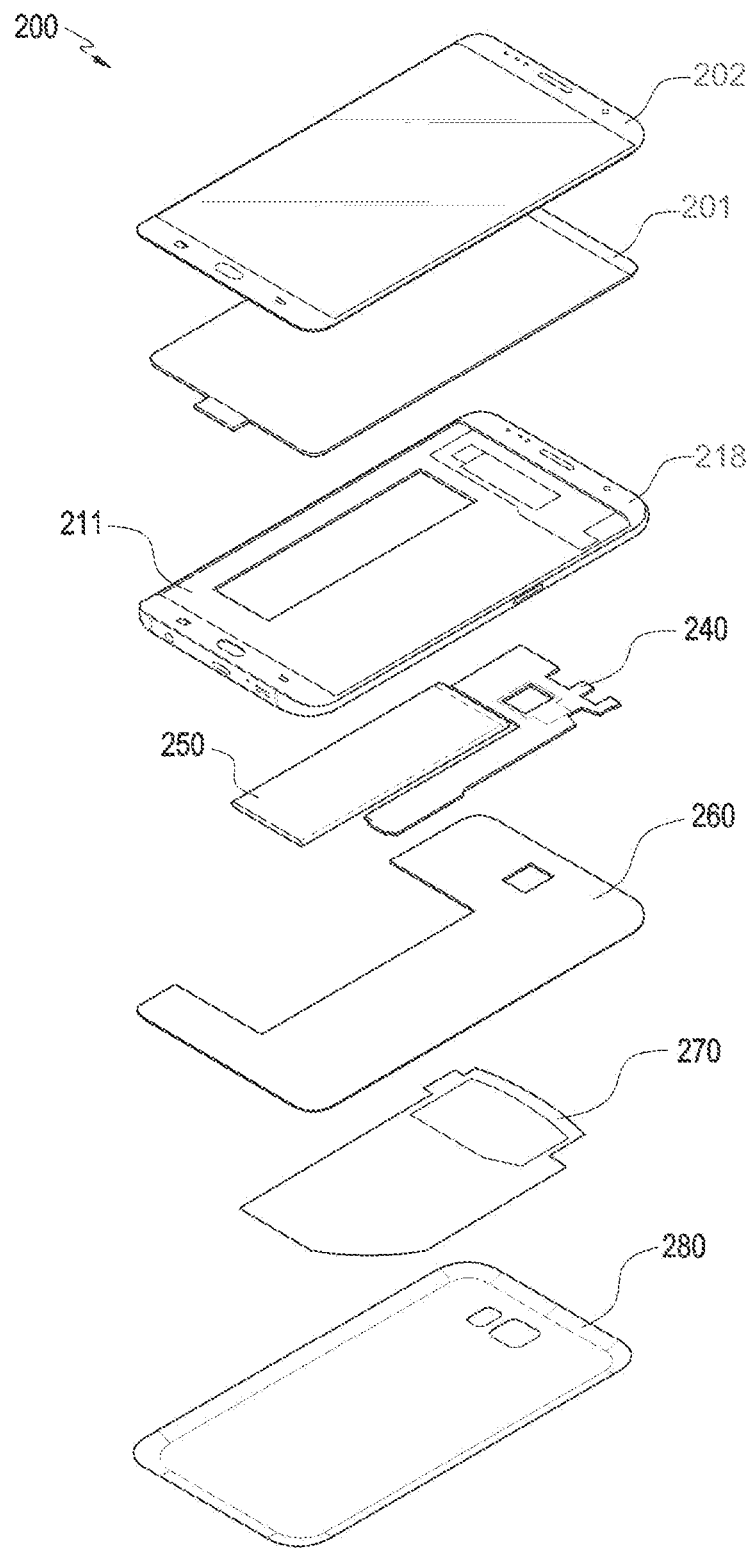
FIG. 2C is an exploded perspective view illustrating an electronic device according to various embodiments of the disclosure.

FIG. 2A is a perspective view illustrating a front surface of an electronic device (e.g., the electronic device 101 of FIG. 1) according to various embodiments of the disclosure, FIG. 2B is a perspective view of a rear surface of the electronic device of FIG. 2A, and FIG. 2C is a perspective view of deployment of the electronic device of FIG. 2A.

Referring to FIGS. 2A and 2B, an electronic device 200 according to an embodiment may include a housing 210 including a first surface (or a front surface) 210A, a second surface (or a rear surface) 210B, and a side surface 210C that surrounds a space between the first surface 210A and the second surface 210B. In another embodiment (not illustrated), the housing may refer to a structure that defines some of the first surface 210A, the second surface 210B, and the side surface 210C of FIG. 1. According to an embodiment, the first surface 210A may be defined by a front plate 202 (e.g., a glass plate or a polymer plate including various coating layers), at least a portion of which is substantially transparent. The second surface 210B may be formed by a rear plate 280 that is substantially opaque. The rear plate 280, for example, may be formed of coated or colored glass, ceramics, a polymer, a metal (e.g., aluminum, stainless steel (STS), or magnesium), or a combination of at least two thereof. The side surface 210C is coupled to the front plate 202 and the rear plate 280, and may be defined by a side bezel structure (or "a side member") 218 including a metal and/or a polymer. In some embodiments, the rear plate 211 and the side bezel structure 218 may be integrally formed and may include the same material (e.g., a metallic material such as aluminum).

According to an embodiment, the electronic device 200 may include at least one of a display 201, audio modules 203, 207, and 214, sensor modules 204 and 219, camera modules 205, 212, and 213, a key input device 215, 216, and 217, an indicator 206, and connector holes 208 and 209. In some embodiments, at least one (e.g., the key input device 215, 216, and 217 or the indicator 206) of the elements may be omitted from the electronic device 200 or another component may be additionally included in the electronic device 200.

The display 201, for example, may be exposed through a corresponding portion of the front plate 202. The display 201 may be coupled to or be disposed to be adjacent to a touch detection circuit, a pressure sensor that may measure the strength (the pressure) of a touch, and/or a digitizer that detects a stylus pen of a magnetic field type.

The audio modules 203, 207, and 214 may include a microphone hole 203 and/or speaker holes 207 and 214, A microphone for acquiring external sounds may be disposed in the microphone hole 203, and in some embodiments, a plurality of microphones may be disposed to detect the direction of a sound. The speaker holes 207 and 214 may include an external speaker hole 207 and/or a communication receiver hole 214. In some embodiments, the speaker hole 207 and 214 and the microphone hole 203 may be realized by one hole or a speaker (e.g., 305 of FIG. 3) may be included while a speaker hole 207 and 214 is not employed.

The sensor modules 204 and 219 may generate an electrical signal or a data value corresponding to an operational state of the interior of the electronic device 200 or an environmental state of the outside. The sensor modules 204 and 219, for example, may include a first sensor module 204 (e.g., a proximity sensor) and a second sensor module (not illustrated) (e.g., a fingerprint sensor) disposed on the first surface 210A of the housing 210, and/or a third sensor module 219 (e.g., a HRM sensor) disposed on the second surface 210B of the housing 210. The fingerprint sensor may be disposed not only on the first surface 210A (e.g., a home key button 215) but also the second surface 210B of the housing 210. The electronic device 200 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

The camera modules 205, 212, and 213 may include a first camera device 205 disposed on the first surface 210A of the electronic device 200, and a second camera device 212 and/or a flash 213 disposed on the second surface 210B. The camera devices 205 and 212 may include one or a plurality of lenses, an image sensor, and/or an image signal processor. The flash 213, for example, may include a light emitting diode or a xenon lamp. In some embodiments, two or more lenses (a wide angle/telephoto lens), and image sensors may be disposed on one surface of the electronic device 200.

The key input devices 215, 216, and 217 may include a home key button 215 disposed on the first surface 210A of the housing 210, a touch pad 216 disposed around the home key button 215, and/or a side key button 217 disposed on the side surface 210C of the housing 210. In another embodiment, the electronic device 200 may not include some or all of the above-mentioned key input devices 215, 216, and 217, and the key input devices 215, 216, and 217 which are not included, may be realized in different forms, such as a soft key, on the display 201.

The indicator 206, for example, may be disposed on the first surface 210A of the housing 210. The indicator 206, for example, may provide state information on the electronic device 200 in the form of light, and may include an LED.

The connector holes 208 and 209 may include a first connector hole 208 that may accommodate a connector (e.g., a USB connector) for transmitting and receiving electric power and/or data to and from an external electronic device and/or a second connector hole (e.g., an earphone jack) 209 that may accommodate a connector for transmitting and receiving an audio signal to and from the external device.

Referring to FIG. 2C, an electronic device 200 may include a side bezel structure 210, a middle plate 211 (e.g., a bracket), a front plate 220, a display 230, a printed circuit board 240, a battery 250, a support member 260 (e.g., a rear case), an antenna 270, and a rear plate 280. In some embodiments, at least one (e.g., the middle plate 211 or the support member 260) of the elements may be omitted from the electronic device 200 or another element may be additionally included in the electronic device 200. At least one of the components of the electronic device 200 may be the same as or similar to at least one of the components of the electronic device 200 of FIGS. 2A and 2B, and a repeated description thereof will be omitted.

The middle plate 211 may be disposed in the interior of the electronic device 200 to be connected to the side bezel structure 210 or to be integrally formed with the side bezel structure 210. The middle plate 211, for example, may be formed of a metallic material and/or a nonmetallic material (e.g., a polymer). The display 230 may be coupled to one surface of the middle plate 211, and the printed circuit board 240 may be coupled to an opposite surface of the middle plate 211. A processor, a memory, and/or an interface may be mounted on the printed circuit board 240. The processor, for example, may include one or more of a central processing unit, an application processor, a graphic processing unit, an image signal processor, a sensor hub processor, or a communication processor.

The memory, for example, may include a volatile and/or nonvolatile memory.

The interface, for example, may include a high definition multimedia interface (HDMI), a universal serial bus (USB) interface, an SD card interface, and/or an audio interface. The interface, for example, may electrically or physically connect the electronic device 200 to an external electronic device, and may include a USB connector, an SD card/MMC connector, and an audio connector.

The battery 250 is a device for supplying electric power to at least one component of the electronic device 200, and for example, may include a primary battery that cannot be recharged, a secondary battery that may be recharged, or a fuel cell. At least a portion of the battery 250, for example, may be disposed on substantially the same plane as the printed circuit board 240. The battery 250 may be integrally disposed in the interior of the electronic device 200, and may be disposed to be detachable from the electronic device 200.

The antenna 270 may be disposed between the rear plate 280 and the battery 250. The antenna 270, for example, may include a near field communication (NFC) antenna, a wireless charging antenna, and/or a magnetic secure transmission (MST) antenna. The antenna 270, for example, may perform short-range communication with an external device, or may wirelessly transmit and receive electric power that is necessary for charging. In another embodiment, an antenna may be formed by one or a combination of the side bezel structure 210 and/or the middle plate 211.

Figure 3:
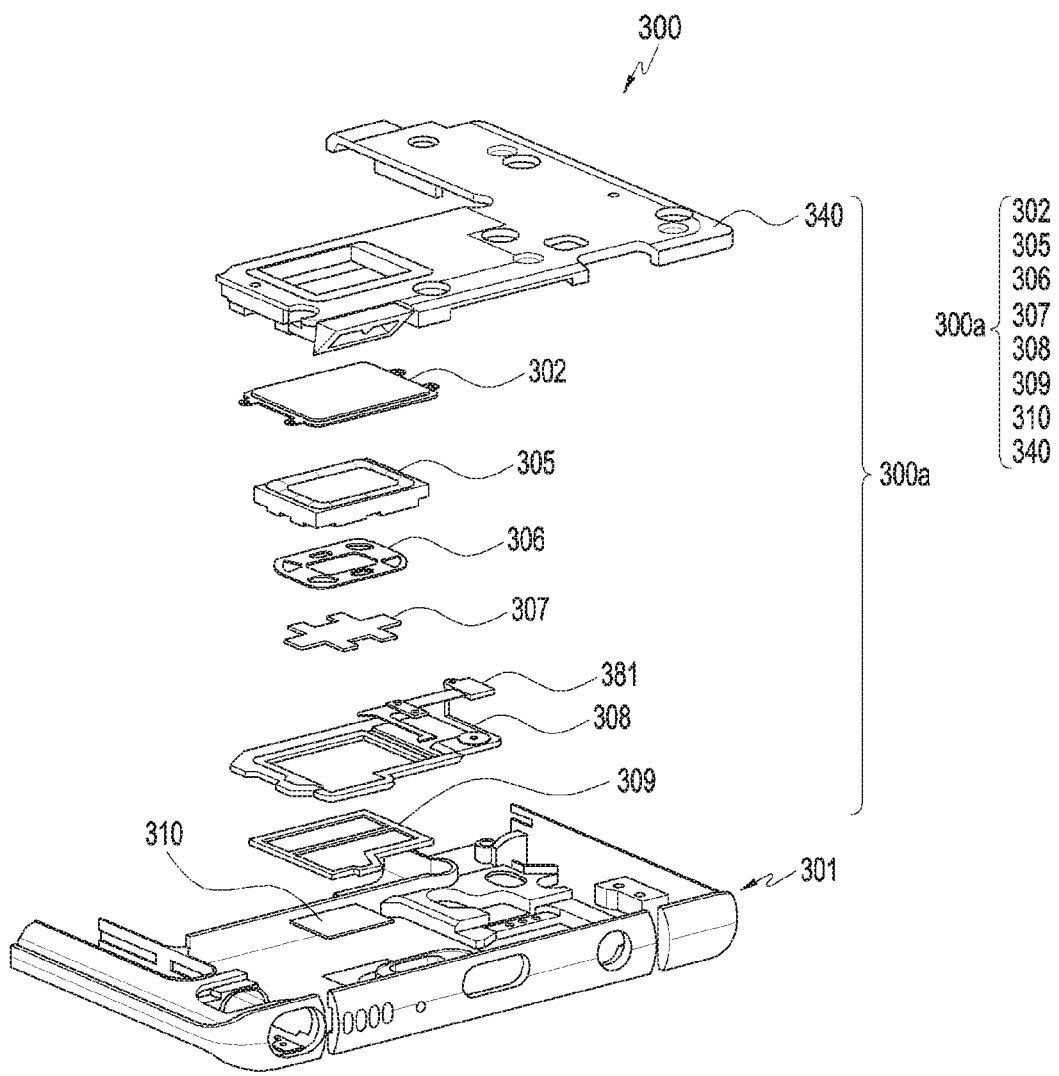
FIG. 3 is an exploded perspective view illustrating a speaker and a heat radiating structure of an electronic device according to one of various embodiments of the disclosure.

FIG. 3 is an exploded perspective view illustrating a speaker and a heat radiating structure of an electronic device 300 according to one of various embodiments of the disclosure.

Referring to FIG. 3, the electronic device 300 according to one of various embodiments of the disclosure may include a housing 301 and a speaker structure 300a. According to an embodiment, the speaker structure 300a may be located in a space that is adjacent to a through-hole between a middle plate portion of the housing 301 and a rear plate of the electronic device. The second support member 340 may be disposed under the housing 301.

According to an embodiment, the speaker structure 300a may include a speaker 305, a first support member 308, which will be described below, a second support member 340, a first thermal interface material 307, which will be described below, a first metal plate 309, which will be described below, a second metal plate 302, which will be described below, and a mesh member 306, which will be described below. The speaker 305 may include a vibration plate (e.g., 455 of FIG. 4A), first and second magnets (e.g., 452 and 453 of FIG. 4A), a coil (e.g., 454 of FIG. 4A), or a yoke (e.g., 406 of FIG. 4A).

According to an embodiment, the speaker 305 may receive currents and generate sounds. A side surface of the speaker 305 may be surrounded by the first support member 308. The first support member 308 may be attached to a sub-circuit board 381. The sub-circuit board 381 may be electrically connected to the speaker 305.

According to an embodiment, a heat radiating structure included in the speaker structure 300a may include a first thermal interface material 307, a first metal plate 309, or a second thermal interface material 310.

According to an embodiment, the heat radiating structure may additionally include a mesh member 306, and the mesh member 306 may be attached to the speaker 305. The mesh member 306 may adjust the amplitude of vibration generated by the speaker 305. According to an embodiment, the mesh member 306 may be formed of a metallic material to transfer heat. According to an embodiment, the first thermal interface material 307 may be attached to the mesh member 306. The first thermal interface material 307 may include at least one of a liquid-state thermal interface material (TIM) and/or a solid-state thermal interface material (TIM). The first thermal interface material 307 may have an elastic force while having thermal conductivity. According to an embodiment, the first metal plate 309 may be attached to the first thermal interface material 307. The first metal plate 309 can prevent rear sound of the speaker 305 from being discharged to the outside of the housing 301 by blocking the rear surface of the speaker 305 together with the first support member 308. According to an embodiment, the first metal plate 309 can shield electromagnetic waves. For example, the first metal plate 309 can prevent electromagnetic waves from being delivered to the display disposed at an opposite side of the housing 301. The first metal plate 309 may include stainless steel (SUS). According to an embodiment, the material of the first metal plate 309 is not limited to stainless steel, and may include various metals or alloys that shield electromagnetic waves. The second metal plate 302 may be disposed between the second support member 340 and the speaker 305. The second metal plate 302 may include stainless steel (SUS). According to an embodiment, the material of the second metal plate 302 is not limited to stainless steel, and may include various materials that shield electromagnetic waves.

According to an embodiment, the second thermal interface material 310 may be attached to the first metal plate 309. The second thermal interface material 310 may include at least one of a liquid-state thermal interface material (TIM) and/or a solid-state thermal interface material (TIM). The second thermal interface material 310 may have an elastic force while having thermal conductivity. According to an embodiment, the second thermal interface material 310 may include the same material as the first thermal interface material 307. According to an embodiment, the material of the second thermal interface material 310 is not limited to the same material as the first thermal interface material 307, and may include another material.

According to an embodiment, the first and second metal plates 302 and 309 may include a shield member for shielding interferences of electromagnetic waves generated by components included in the electronic device.

Figure 4A:
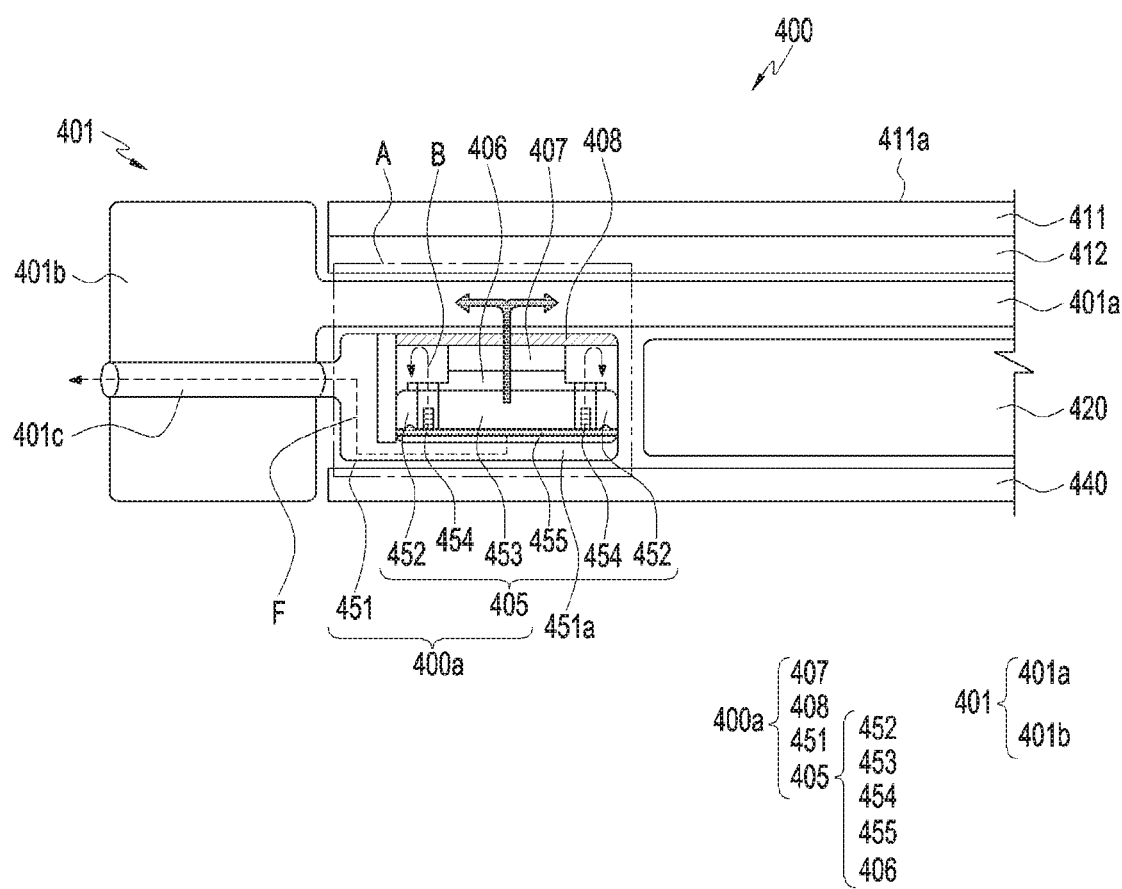
FIG. 4A is a cross-sectional view illustrating a speaker and a heat radiating structure of an electronic device according to one of various embodiments of the disclosure.
Figure 4B:
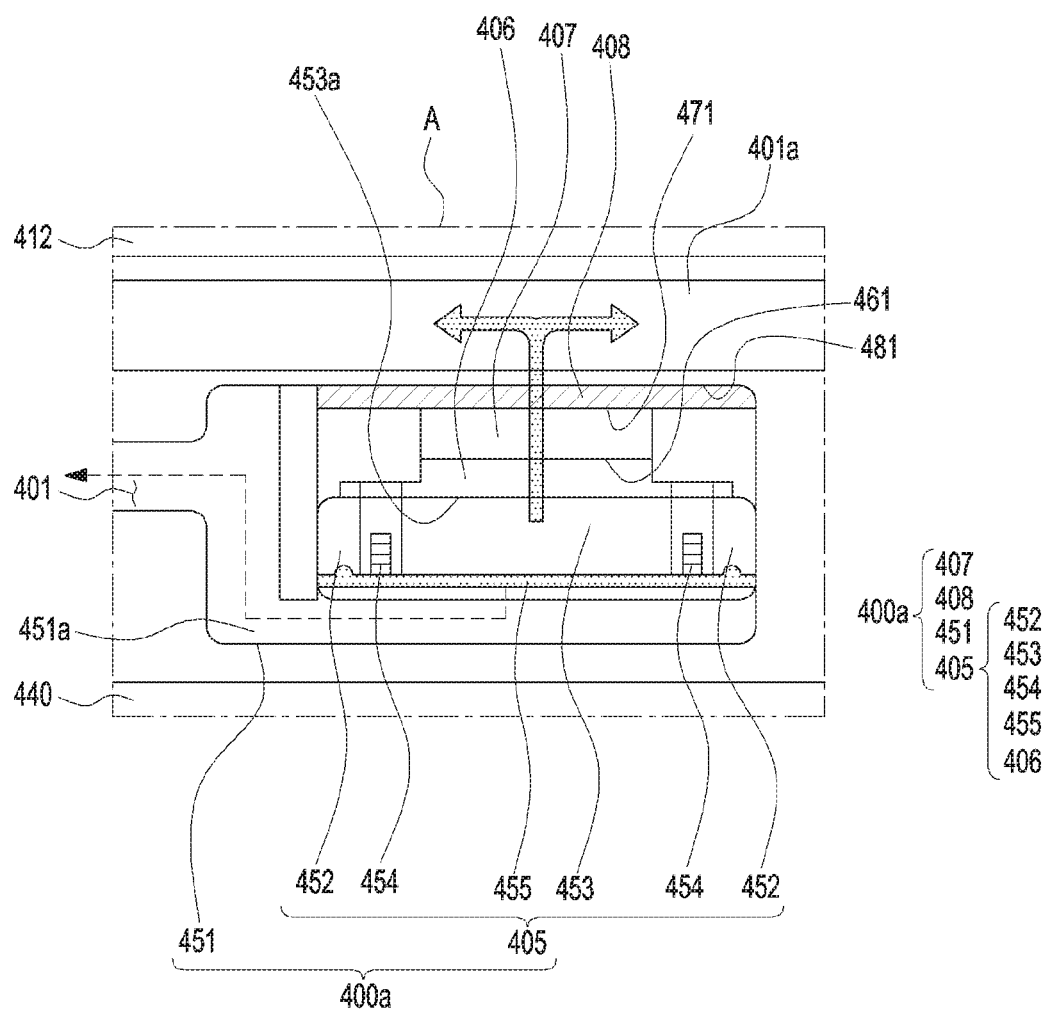
FIG. 4B is an enlarged view of portion A of FIG. 4A according to one of various embodiments of the disclosure.

FIG. 4A is a cross-sectional view illustrating a speaker (e.g., the speaker 305 of FIG. 3) and a heat radiating structure of an electronic device 400 (e.g., the electronic device 300 of FIG. 3) according to one of various embodiments of the disclosure. FIG. 4B is an enlarged view of portion A of FIG. 4A according to one of various embodiments of the disclosure, and is a view including a first thermal interface material 407 (e.g., the first thermal interface material 307 of FIG. 3). For example, in FIG. 4B, only the first thermal interface material 407 may be included without using the second thermal interface material 409 (e.g., the second thermal interface material 310 of FIG. 3).

Referring to FIGS. 4A and 4B, the electronic device 400 according to one of various embodiments of the disclosure may include a housing 401 (e.g., the housing 301 of FIG. 3) including a first part 401a (cooling member or middle plate) and a second part 401b, a display 412 and a speaker structure 400a. The speaker structure 400a may include a speaker 405, or/and a heat radiating structure 407, and 408.

According to an embodiment, the housing 401 may include a first part 401a and/or a second part 401b. The first part 401a and/or the second part 401b may include a metallic material. The second part 401b may extend from the first part 401a. For example, the second part 401b may be integrally formed with the first part 401a through die-casting. The first part 401a may be called a cooling member or the middle plate. The second part 401b may be called a side member, and may form a part of an external appearance of the electronic device. According to various embodiments of the disclosure, heat generated by the speaker 405 may be promptly discharged to the outside of the speaker 405 through the first part 401a and the second part 401b. According to an embodiment, the front plate 411 and the display 412 may be stacked on the first part 401a. According to an embodiment, the rear plate 440 may be disposed under the first part 401a. According to an embodiment, the cooling member 401a may support various electronic components such as the display 412, a battery 420, or the speaker 405. The side member 401b may extend from the cooling member 401a. The side member 401b may include at least one through-hole, and for example, the through-hole may include a radiation hole 401c.

According to an embodiment, the speaker structure 400a may include a case 451 surrounding the speaker 405 and the heat radiating structure 407, and 408. the speaker 405 may include a yoke 406, a first magnet 452, a second magnet 453, a coil 454, and/or a vibration plate 455. The case 451 may include steel. The case 451 may be bolt-coupled to the cooling member 401*a*. According to an embodiment, the coupling of the case 451 is not limited to the bolt-coupling to the cooling member 401*a*, but may be coupled in various schemes such as bonding by an adhesive. The first magnet 452 may be mounted in the case 451. The yoke 406 may be attached to a first surface of the first magnet 452 and a first surface 453*a* of the second magnet 453. The yoke 406 may include a metallic material and have the form of a plate. The first magnet 452 may be a permanent magnet. The second magnet 453 may be located inside the first magnet 452. For example, the first magnet 452 may surround the second magnet 453. The second magnet 453 may be a permanent magnet. The coil 454 is mounted in the interior of the case 451, and may be disposed between the first magnet 452 and the second magnet 453. The coil 454 may be a voice coil. The coil 454 may receive a current and generate a magnetic force. The coil 454 may move between the first magnet 452 and the second magnet 453 toward the front or rear side by a change in a magnetic force and may vibrate. According to an embodiment, the vibration plate 455 may be coupled to the coil 454. The vibration plate 455 may generate sound through vibration of the coil 454. The front sound of the vibration plate 455 may travel toward the rear plate 440, and after colliding with an inner wall of the case 451, may travel along a passage 451*a* of the case 451. The passage 451*a* of the case 451 may be connected to the radiation hole 401*c*. The front sound F of the vibration plate 455 may be discharged to the outside of the side member 401*b* of the housing through the radiation hole 401*c* via the passage 451*a*. According to an embodiment, the rear sound B of the vibration plate 455 may travel along an opening of the yoke 406.

According to an embodiment, the heat radiating structure 407, and 408 may include a first thermal interface material 407 (e.g., the first thermal interface material 307 of FIG. 3), and/or a metal plate 408 (e.g., the metal plate 309 of FIG. 3). According to an embodiment, the coil 454 may generate heat. The heat generated by the coil 454 may be first heat generated by the coil when the coil receives current, second heat generated by vibration of the coil 454, and third heat generated according to generation of a magnetic field of the coil 454. The heat generated by the coil 454 may be transferred to the first magnet 452 or the second magnet 453. The heat transferred to the first magnet 452 or the second magnet 453 may be transferred to the yoke 406. The first thermal interface material 407 may be attached to the first surface 461 of the yoke 406. The heat transferred to the yoke 406 may be transferred to the first thermal interface material 407. The metal plate 408 may be attached to the first surface 471 of the first thermal interface material 407. The heat transferred to the first thermal interface material 407 may be transferred to the metal plate 408. The heat transferred to the metal plate 408 may be discharged to the outside of the speaker. According to an embodiment, the case 451 may be spaced apart from the rear plate 440. Because the case 451 is spaced apart from the rear plate 440, the heat generated by the speaker 405 can be prevented from being transferred to the rear plate 440.

According to an embodiment, when the speaker 405 is attached to a front surface of the cooling member 401*a*, the radiation hole 401*c* may be formed adjacent to the vibration plate 455 of the speaker 405.

According to an embodiment, the yoke 406 may be attached to the first thermal interface material 407 by a first bonding member. According to an embodiment, the first thermal interface material 407 may be attached to the metal plate 408 by using a second bonding member.

Figure 4C:
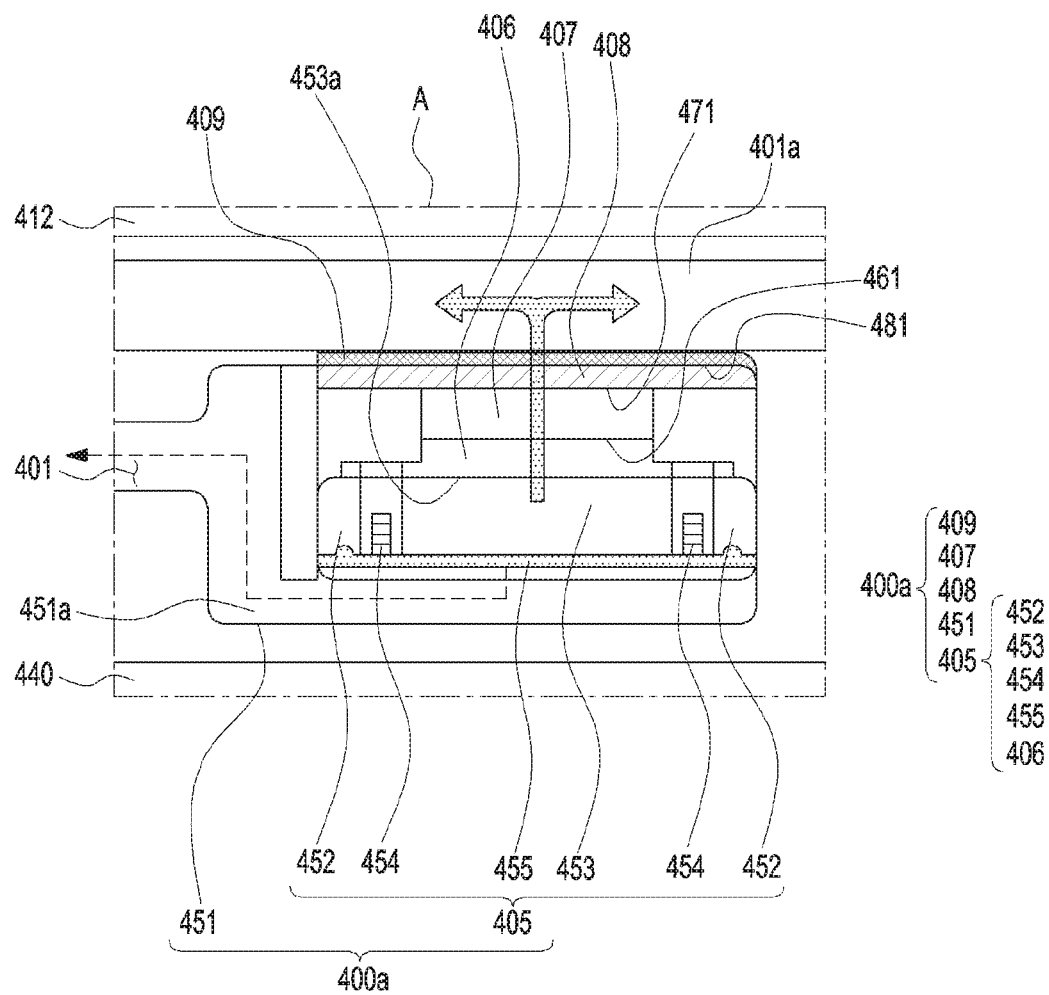
FIG. 4C is an enlarged view of portion A of FIG. 4A according to one of other various embodiments of the disclosure.

FIG. 4C is an enlarged view of portion A of FIG. 4A according to one of other various embodiments of the disclosure, and is a view illustrating a structure provided with both the first and second interface materials 408 and 409.

Referring to FIG. 4C, the electronic device 400 according to one of various embodiments of the disclosure may include a housing 401 (e.g., the housing 301 of FIG. 3) including a first part 401*a* (colling member or middle plate) and a second part 401*b*, a display 412 and a speaker structure 400*a*. The speaker structure 400*a* may include a speaker 405, or/and a heat radiating structure 407, 408, and 409.

According to an embodiment, the housing 401 may include a first part 401*a* and/or a second part 401*b*. The first part 401*a* and/or the second part (e.g., 401*b* of FIG. 4A) may include a metallic material. The second part (e.g., 401*b* of FIG. 4A) may extend from the first part 401*a*. For example, the second part (e.g., 401*b* of FIG. 4A) may be integrally formed with the first part 401*a* through die-casting. The first part 401*a* may be called a cooling member or the middle plate. The second part (e.g., 401*b* of FIG. 4A) may be called a side member, and may form a part of an external appearance of the electronic device. According to various embodiments of the disclosure, heat generated by the speaker 405 may be promptly dispersed and discharged to the outside of the speaker 405 through the first part 401*a* and/or the second part (e.g., 401*b* of FIG. 4A). According to an embodiment, the front plate (e.g., 411 of FIG. 4A) and the display (e.g., 412 of FIG. 4A) may be stacked on the first part 401*a*. According to an embodiment, the rear plate (e.g., 440 of FIG. 4A) may be disposed under the first part 401*a*. According to an embodiment, the cooling member 401*a* may support various electronic components such as the display (e.g., 412 of FIG. 4A), the battery (e.g., 420 of FIG. 4A), or the speaker 405. The side member 401*b* may extend from the cooling member (e.g., 401*a* of FIG. 4A). The side member 401*b* may include at least one through-hole, and for example, the through-hole may include a radiation hole (e.g., 401*c* of FIG. 4A).

According to an embodiment, the speaker structure 400*a* may include a case 451 surrounding the speaker 405 and the heat radiating structure 407, 408 and 409. the speaker 405 may include a yoke 406, a first magnet 452, a second magnet 453, a coil 454, and/or a vibration plate 455. The case 451 may include steel. The case 451 may be bolt-coupled to the cooling member 401*a*. According to an embodiment, the coupling of the case 451 is not limited to the bolt-coupling to the cooling member 401*a*, but may be coupled in various schemes such as bonding by an adhesive. The yoke 406 may be attached to a first surface of the first magnet 452 and a first surface 453*a* of the second magnet 453. The yoke 406 may include a metallic material and have the form of a plate. The first magnet 452 may be mounted in the case 451. The first magnet 452 may be a permanent magnet. The second magnet 453 may be located inside the first magnet 452. For example, the first magnet 452 may surround the second magnet 453. The second magnet 453 may be a permanent magnet. The coil 454 is mounted in the interior of the case 451, and may be disposed between the first magnet 452 and the second magnet 453. The coil 454 may be a voice coil. The coil 454 may receive a current and generate a magnetic force. The coil 454 may move between the first magnet 452 and the second magnet 453 toward the front or rear side by a change in a magnetic force and may vibrate. According to an embodiment, the vibration plate 455 may be coupled to the coil 454. The vibration plate 455 may generate sound through vibration of the coil 454. The front sound of the vibration plate 455 may travel toward the rear plate (e.g., 440 of FIG. 4A), and after colliding with an inner wall of the case 451, may travel along a sound conduit (e.g., 451a of FIG. 4A) of the case 451. The sound conduit (e.g., 451a of FIG. 4A) of the case 451 may be connected to the radiation hole (e.g., 401c of FIG. 4A). The front sound (e.g., F of FIG. 4A) of the vibration plate 455 may be discharged to the outside of the side member 401b of the housing through the radiation hole 401c via the sound conduit (e.g., 451a of FIG. 4A). According to an embodiment, the rear sound (e.g., B of FIG. 4A) of the vibration plate 455 may travel along an opening of the yoke 406.

According to an embodiment, the heat radiating structure 407, 408, and 409 may include a first thermal interface material 407, a metal plate 408, and/or a second thermal interface material 409. According to an embodiment, the coil 454 may generate heat. The heat generated by the coil 454 may be first heat generated by the coil when the coil receives current, second heat generated by vibration of the coil 454, and third heat generated according to generation of a magnetic field of the coil 454. The heat generated by the coil 454 may be transferred to the first magnet 452 or the second magnet 453. The heat transferred to the first magnet 452 or the second magnet 453 may be transferred to the yoke 406. The first thermal interface material 407 may be attached to the first surface 461 of the yoke 406. The heat transferred to the yoke 406 may be transferred to the first thermal interface material 407. The metal plate 408 may be attached to the first surface 471 of the first thermal interface material 407. The heat transferred to the first thermal interface material 407 may be transferred to the metal plate 408. The second thermal interface material 409 may be attached to the first surface 481 of the metal plate 408. The heat transferred to the metal plate 408 may be transferred to the second thermal interface material 409. The first surface of the second thermal interface material 409 may be attached to the cooling member 401a of the electronic device. The heat transferred to the second thermal interface material 409 may be transferred to the cooling member 401a. For example, the heat generated by the speaker 405 may be transferred to the cooling member 401a sequentially via the yoke 406, the first thermal interface material 407, the metal plate 408, and the second thermal interface material 409. According to an embodiment, the cooling member 401a may include a heat sink or a heat pipe. the heat pipe may configured to flow a fluid.

According to an embodiment, the case 451 may be spaced apart from the rear cover 440. Because the case 451 is spaced apart from the rear cover 440, the heat generated by the speaker 405 can be prevented from being transferred to the rear cover 440.

According to an embodiment, when the speaker 405 is attached to a front surface of the cooling member 401a, the radiation hole 401c may be formed adjacent to the vibration plate 455 of the speaker 405.

According to an embodiment, the yoke 406 may be attached to the first thermal interface material 407 by the first bonding member. According to an embodiment, the first thermal interface material 407 may be attached to the metal plate 408 by using a second bonding member. According to an embodiment, the metal plate 408 may be attached to the second thermal interface material 409 by a third bonding member. According to an embodiment, the second thermal interface material 409 may be attached to the cooling member 401a by using a fourth bonding member. According to an embodiment, the first, second, third, and fourth bonding members may be formed of the same material. According to an embodiment, the materials of the first, second, third, and fourth bonding members may not be limited to the same material, but may be formed of different materials.

Figure 5:
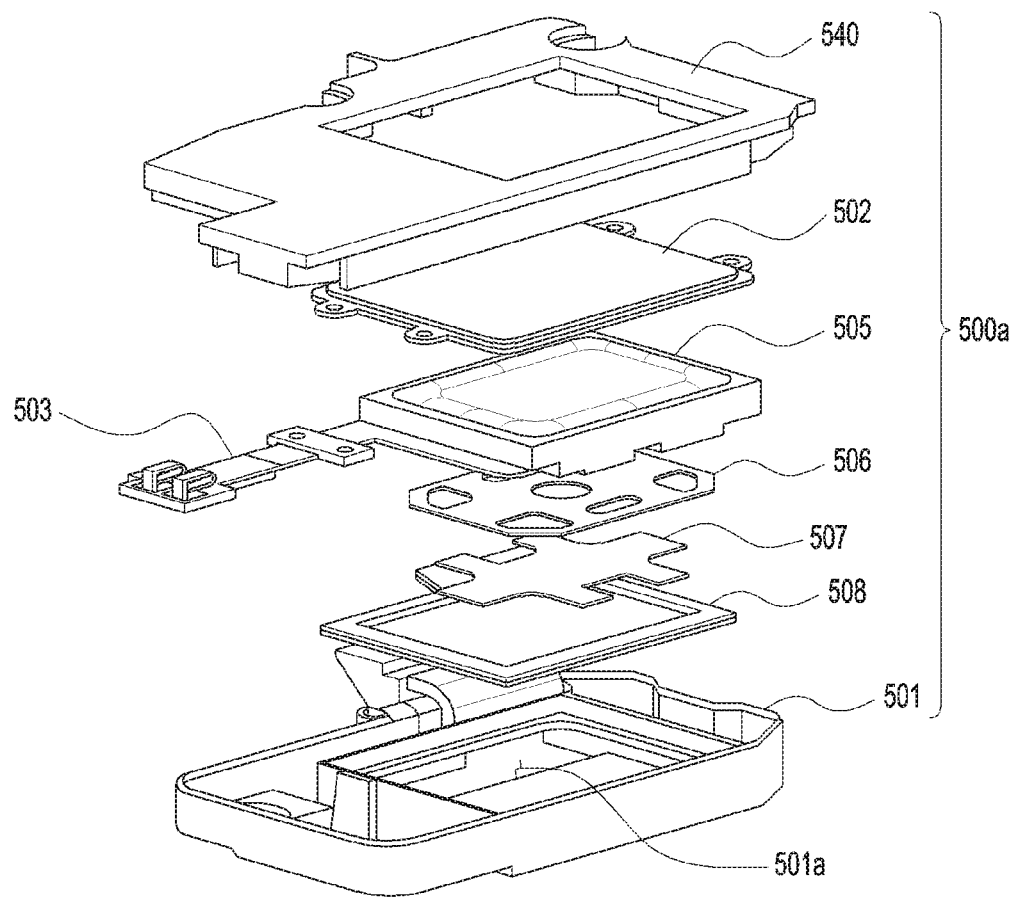
FIG. 5 is a perspective view illustrating a speaker and a heat radiating structure according to another one of various embodiments of the disclosure.

FIG. 5 is a perspective view illustrating a speaker (e.g., the speaker 405 of FIG. 4A) and a heat radiating structure according to another one of various embodiments of the disclosure.

Referring to FIG. 5, a speaker structure 500a according to another one of various embodiments of the disclosure may include a speaker 505, or/and a heat radiating structure 506, 507 and 508. the speaker 505 may be surrounded by a first support member 501 and a second support member 540. The first support member 501 may be attached to the housing (e.g., the housing 401 of FIG. 4A). According to an embodiment, the first support member 501 may be integrally formed with the housing (e.g., the housing 401 of FIG. 4A). The second support member 540 may face the rear plate (e.g., the rear plate 440 of FIG. 4A). For example, the second support member 540 may be spaced apart from the rear plate (e.g., the rear plate 440 of FIG. 4A). The second metal plate 502 may be disposed between the second support member 540 and the speaker 505. The second metal plate 502 may include stainless steel. According to an embodiment, the material of the second metal plate 502 is not limited to stainless steel, and may include various materials that shield electromagnetic waves.

According to an embodiment, the heat radiating structure 506, 507, and 508 may include a mesh member 506, a first thermal interface material 507, and a metal plate 508 while not including a second thermal interface material (e.g., the second thermal interface material 409 of FIG. 4C). The mesh member 506 may be attached to the speaker 505. The first thermal interface material 507 may be attached to the mesh member 506. The metal plate 508 may be attached to the housing (e.g., the housing 401 of FIG. 4A) through an opening 501a formed in the first support member 501.

Figure 6A:
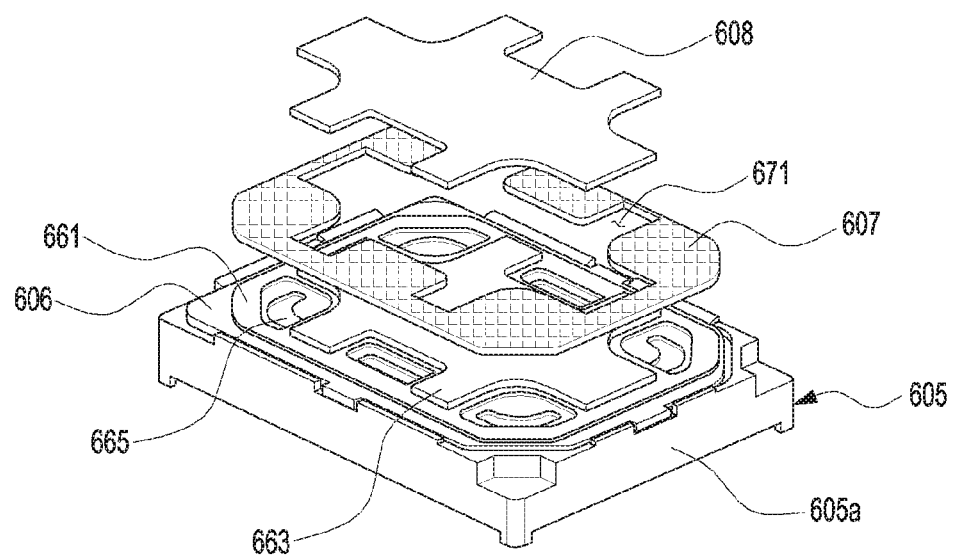
FIG. 6A is a perspective view illustrating a speaker and a heat radiating structure according to another one of various embodiments of the disclosure.
Figure 6B:
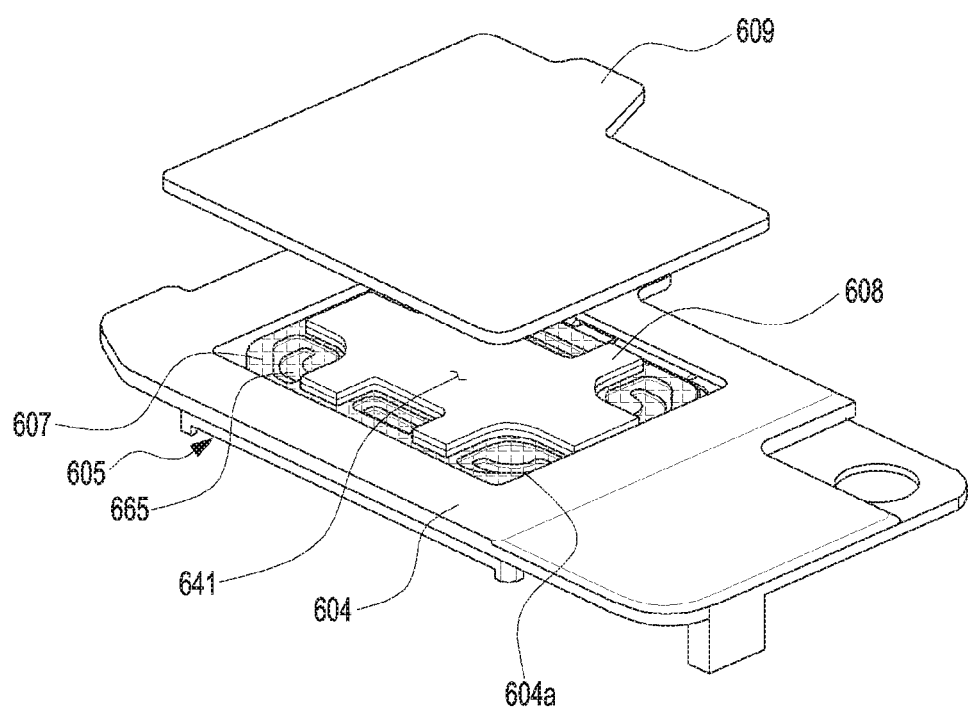
FIG. 6B is a perspective view illustrating a speaker and a heat radiating structure according to another one of various embodiments of the disclosure.

FIG. 6A is a perspective view illustrating a heat radiating structure (e.g., the heat radiating structure 506, 507, and 508 of FIG. 5) according to another one of various embodiments of the disclosure. FIG. 6B is a perspective view illustrating a heat radiating structure according to another one of various embodiments of the disclosure.

Referring to FIGS. 6A and 6B, a heat radiating structure 607, 608, and 609 according to another one of various embodiments of the disclosure may include a mesh member 607, a first thermal interface material 608, and/or a metal plate 609.

According to an embodiment, the speaker 605 may include a case 605a forming a first opening (not illustrated). A vibration plate (e.g., the vibration plate 455 of FIG. 4A) of the speaker 605 may generate rear sound (e.g., the rear sound B of FIG. 4A). The rear sound (e.g., the rear sound B of FIG. 4A) may travel along the first opening.

According to an embodiment, a yoke 606 attached to the speaker 605 may include a first yoke 661 and a second yoke 663. The first yoke 661 may be seated on one surface of the yoke 606, and a second opening 665 connected to the first opening of the case 605a may be formed in the first yoke 661. The rear sound (e.g., the rear sound B of FIG. 4A) may travel along the first opening and the second opening 665. The second yoke 663 may be seated on one surface of the first yoke 661, and may not cover the second opening 665.

According to an embodiment, the mesh member 607 may be seated on one surface of the second yoke 663. The mesh member 607 may partially cover the second opening 665. The mesh member 607 may prevent foreign substances (e.g., dust) from being introduced into the first opening and the second opening 665. A third opening 671 that accommodates the first thermal interface material 608 may be formed in the mesh member 607. According to an embodiment, the mesh member 607 is not limited to the third opening 671, but may have a structure in which the third opening 671 is not present.

According to an embodiment, the first thermal interface material 608 may be accommodated in the third opening 671 while having a size corresponding to the third opening 671. The first thermal interface material 608 does not overlap the second opening 665, and thus may not hinder the rear sound (e.g., the rear sound B of FIG. 4A) from traveling.

According to an embodiment, the speaker 605 may be surrounded by the support member 604. An opening 604a may be formed in the support member 604. The metal plate 609 may be seated on one surface 641 of the first thermal interface material 608. The metal plate 609 may cover the opening 604a of the support member 604. The metal plate 609 can prevent the rear sound (e.g., the rear sound B of FIG. 4A) from being discharged to the outside.

Figure 7:
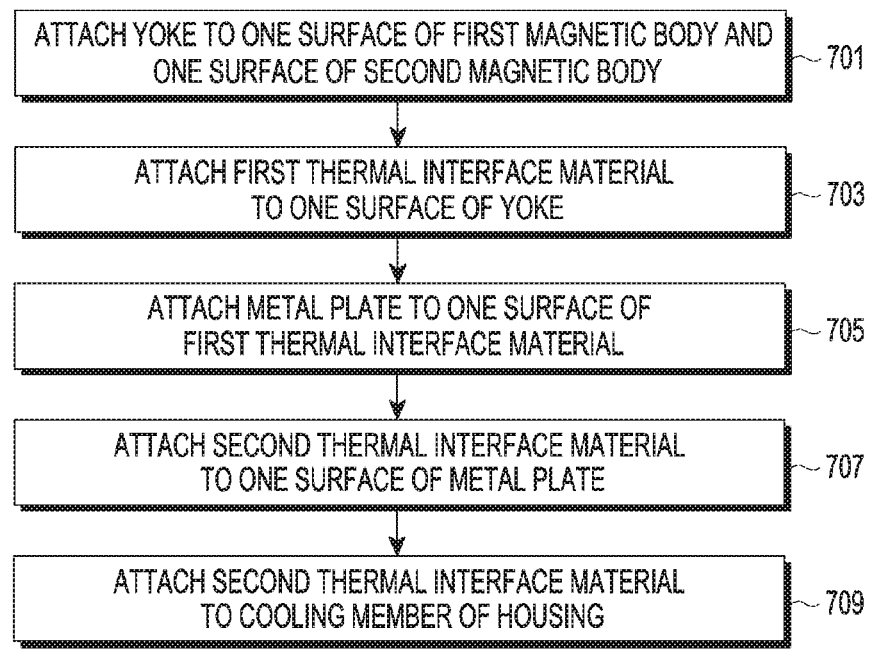
FIG. 7 is a flowchart illustrating a method for manufacturing a speaker and a heat radiating structure according to various embodiments of the disclosure.

FIG. 7 is a flowchart illustrating a method for assembling a heat radiating structure (the heat radiating structure 407, 408, and 409) according to various embodiments of the disclosure.

Referring to FIG. 7, the yoke 406 may be attached to one surface of a first magnet (e.g., the first magnet 452 of FIG. 4C) and one surface of a second magnet (e.g., the second magnet 453 of FIG. 4C) of a speaker (e.g., the speaker 405 of FIG. 4C) (701).

According to an embodiment, a first thermal interface material (e.g., the first thermal interface material 407 of FIG. 4C) may be attached to one surface of the yoke 406 (703).

According to an embodiment, a metal plate (e.g., the metal plate 408 of FIG. 4C) may be attached to one surface of the first thermal interface material (e.g., the first thermal interface material 407 of FIG. 4C) (705).

According to an embodiment, a second thermal interface material (e.g., the second thermal interface material 409 of FIG. 4C) may be attached to one surface of the metal plate (e.g., the metal plate 408 of FIG. 4C) (707).

According to an embodiment, the second thermal interface material (e.g., the second thermal interface material 409 of FIG. 4C) may be attached to a support part (e.g., the support part 401a of FIG. 4C) (709).

As described above, according to various embodiments of the disclosure, a heat radiating structure included in an electronic device may include: a speaker; a first thermal interface material configured to receive heat from the speaker while contacting the speaker; a metal plate configured to receive heat from the first thermal interface material while contacting the first thermal interface material; and a second thermal interface material configured to receive heat from the metal plate while contacting the metal plate and transfer the heat to a cooling member of the electronic device.

According to various embodiments of the disclosure, an electronic device (e.g., 300 of FIG. 3) may include: a housing (e.g., 301 of FIG. 3) including a front plate (220 of FIG. 2C), a rear plate (e.g., 280 of FIG. 2C) opposed to the front plate, a side member surrounding a space between the front plate and the rear plate, the side member including at least one through-hole; a display (e.g., 412 of FIG. 4A) exposed to the outside through the front plate; a middle plate (e.g., 211 of FIG. 2C) disposed between the display and the rear plate and including a surface facing the rear plate; and a speaker structure located in the space that is adjacent to the through-hole between the middle plate and the rear plate, and the speaker structure may include: a metal plate (e.g., 309 of FIG. 3) attached to the surface of the middle plate; a yoke (e.g., 406 of FIG. 4A) disposed apart from the metal plate toward the rear plate; a thermal interface material (TIM) (e.g., 307 of FIG. 3, a first thermal interface material) located between the metal plate and the yoke while contacting the metal plate and the yoke; a vibration plate (e.g., 455 of FIG. 4A) disposed apart from the yoke toward the rear plate, and disposed apart from the rear plate; and a magnet (e.g., 452 and 453 of FIG. 4A) disposed between the yoke and the vibration plate.

According to various embodiments of the disclosure, the thermal interface material (TIM) may include at least one of a liquid-state thermal interface material (TIM) and/or a solid-state thermal interface material (TIM).

According to various embodiments of the disclosure, the metal plate may be formed of stainless steel (SUS).

According to various embodiments of the disclosure, a sound conduit may be formed between the vibration plate, the rear plate, and the through-hole.

According to various embodiments of the disclosure, the middle plate may be integrally formed with the side member.

According to various embodiments of the disclosure, the middle plate may be formed of a thermally conductive material.

According to various embodiments of the disclosure, the thermally conductive material may include aluminum.

According to various embodiments of the disclosure, the speaker structure may include a case at least partially surrounding at least one of the metal plate, the yoke, the thermal interface material (TIM), the vibration plate, or the magnet.

According to various embodiments of the disclosure, the case may include a first support member and/or a second support member.

According to various embodiments of the disclosure, the first support member and/or the second support member may include an antenna.

According to various embodiments of the disclosure, an electronic device may include: a housing including a front plate, a rear plate opposed to the front plate, a side member surrounding a space between the front plate and the rear plate, the side member including at least one through-hole; a display exposed to the outside through the front plate; a middle plate disposed between the display and the rear plate and including a surface facing the rear plate; and a speaker structure located in the space that is adjacent to the through-hole between the middle plate and the rear plate, and the speaker structure may include: a metal plate; a yoke disposed apart from the metal plate toward the rear plate; a first thermal interface material (TIM) located between the metal plate and the yoke while contacting the metal plate and the yoke; a vibration plate disposed apart from the yoke toward the rear plate, and disposed apart from the rear plate; and a magnet disposed between the yoke and the vibration plate, and a second thermal interface material (TIM) may be located between the metal plate of the speaker structure and the middle plate while contacting the metal plate and the middle plate.

According to various embodiments of the disclosure, the first thermal interface material (TIM) and/or the second thermal interface material (TIM) may include at least one of a liquid-state thermal interface material (TIM) and/or a solid-state thermal interface material (TIM).

According to various embodiments of the disclosure, the metal plate may cover a support member included in the speaker structure to prevent rear sound of the vibration plate from being radiated to the outside of a case included in the speaker structure, and According to various embodiments of the disclosure, the metal plate may include a metallic body having a thermal conductivity and ferromagnetism.

According to various embodiments of the disclosure, the electronic device may further include: an additional metal plate between the support member included in a speaker included in the speaker structure and the speaker.

According to various embodiments of the disclosure, an electronic device including a heat radiating structure may include: a housing including a front plate, a rear plate facing a direction that is opposite to the front plate, a side member surrounding a space between the front plate and the rear plate, the side member including at least one through-hole; a display exposed to the outside through the front plate; a middle plate disposed between the display and the rear plate and including a surface facing the rear plate; and a speaker structure located in the space that is adjacent to the through-hole between the middle plate and the rear plate, and the electronic device may further include: a heat radiating structure configured to transfer heat generated by the speaker to the housing, and the heat radiating structure may include: a first thermal interface material configured to receive heat from the speaker while contacting the speaker; a metal plate configured to receive heat from the first thermal interface material while contacting the first thermal interface material; and a second thermal interface material configured to receive heat from the metal plate while contacting the metal plate and transfer the heat to a cooling member of the electronic device.

According to various embodiments of the disclosure, the electronic device may further include: a mesh member (e.g., 607 of FIG. 6) disposed between the yoke included in the speaker and the metal plate and configured to prevent foreign substances from being introduced into a second opening formed in the yoke.

According to various embodiments of the disclosure, the mesh member may include a metallic material.

According to various embodiments of the disclosure, the mesh member may include a third opening that accommodates the first thermal interface material.

According to various embodiments of the disclosure, the electronic device may further include: a first bonding member configured to attach the yoke and the first thermal interface material; a second bonding member configured to attach the first thermal interface material and the metal plate; a third bonding member configured to attach the metal plate and the second thermal interface material; and a fourth bonding member configured to attach the second thermal interface material and the cooling member.

According to various embodiments of the disclosure, the material of the first thermal interface material may be the same as the material of the second thermal interface material.

Meanwhile, although the detailed embodiments have been described, it is apparent to an ordinary person in the art that various modifications may be made without departing from the scope of the disclosure.

The invention claimed is:

1. An electronic device comprising:
a housing comprising a front plate, a rear plate opposed to the front plate, a middle plate including a first surface toward the front plate and a second surface toward the rear plate, and a side member extending from the middle plate and including a through-hole opened outside the housing;
a display exposed to an outside through the front plate, and seated on the first surface of the middle plate;
a speaker structure disposed between the second surface of the middle plate and the rear plate,
wherein the speaker structure comprises:
a metal plate spaced apart from the second surface of the middle plate;
a yoke disposed apart from the metal plate toward the rear plate;
a first thermal interface material disposed between the metal plate and the yoke and attached to the metal plate and the yoke;
a second thermal interface material disposed between the metal plate and the middle plate, and attached to the second surface of the middle plate by a bonding member;
a vibration plate disposed apart from the yoke toward the rear plate, and disposed apart from the rear plate; and
a magnet disposed between the yoke and the vibration plate.

2. The electronic device of claim 1, wherein each of the first and second thermal interface materials comprises at least one of a liquid-state thermal interface material or a solid-state thermal interface material.

3. The electronic device of claim 1, wherein the metal plate comprises stainless steel.

4. The electronic device of claim 1, wherein a sound conduit is formed between the vibration plate, the rear plate, and the through-hole.

5. The electronic device of claim 1, wherein the middle plate is integrally formed with the side member and comprises a thermally conductive material including aluminum.

6. The electronic device of claim 1, wherein the speaker structure further comprises a case at least partially surrounding at least one of the metal plate, the yoke, the first and second thermal interface materials, the vibration plate, or the magnet.

7. The electronic device of claim 6, wherein the electronic device further comprises an antenna.

8. The electronic device of claim 1, wherein the first thermal interface material and the second thermal interface material include a same material.

9. The electronic device of claim 1, wherein the display is disposed between the first surface of the middle plate and the front plate.

* * * * *